(12) United States Patent
Manz et al.

(10) Patent No.: US 8,390,289 B2
(45) Date of Patent: Mar. 5, 2013

(54) MAGNET ARRANGEMENT FOR GENERATING AN NMR-COMPATIBLE HOMOGENEOUS PERMANENT MAGNETIC FIELD

(75) Inventors: Bertram Manz, St. Ingbert (DE); Frank Volke, St. Ingbert (DE); Martin Benecke, Homburg (DE)

(73) Assignee: Fraunhofer-Gesellschaft zur Förderung der Angewandten Forschung E.V., Munich (DE)

(*) Notice: Subject to any disclaimer, the term of this patent is extended or adjusted under 35 U.S.C. 154(b) by 304 days.

(21) Appl. No.: 12/601,959

(22) PCT Filed: May 31, 2007

(86) PCT No.: PCT/EP2007/004832
§ 371 (c)(1),
(2), (4) Date: May 28, 2010

(87) PCT Pub. No.: WO2008/145167
PCT Pub. Date: Dec. 4, 2008

(65) Prior Publication Data
US 2010/0231219 A1 Sep. 16, 2010

(51) Int. Cl.
*G01V 3/00* (2006.01)
(52) U.S. Cl. ........................................ 324/318; 324/319
(58) Field of Classification Search .......... 324/300–322; 335/299, 216, 296–301; 600/407–445
See application file for complete search history.

(56) References Cited

U.S. PATENT DOCUMENTS

| | | | |
|---|---|---|---|
| 4,411,270 A * | 10/1983 | Damadian | 600/410 |
| 4,672,346 A | 6/1987 | Miyamoto et al. | |
| 4,764,743 A * | 8/1988 | Leupold et al. | 335/306 |
| 4,937,545 A | 6/1990 | Chaillout et al. | |
| 4,944,777 A | 7/1990 | Shmayda et al. | |
| 6,150,911 A * | 11/2000 | Katznelson et al. | 335/299 |
| 6,163,154 A | 12/2000 | Anderson et al. | |
| 6,333,630 B1 | 12/2001 | Holsinger et al. | |
| 6,404,197 B1 | 6/2002 | Anderson et al. | |
| 6,489,872 B1 | 12/2002 | Fukushima et al. | |
| 6,859,123 B2 * | 2/2005 | Zheng et al. | 335/296 |
| 7,023,309 B2 * | 4/2006 | Laskaris et al. | 335/306 |

(Continued)

FOREIGN PATENT DOCUMENTS

| | | |
|---|---|---|
| DE | 199 39 626 A1 | 3/2001 |
| JP | 2-184003 | 7/1990 |
| WO | WO 99/32897 | 7/1999 |
| WO | WO 2004/008168 | 1/2004 |

*Primary Examiner* — Brij Shrivastav
(74) *Attorney, Agent, or Firm* — Antonelli, Terry, Stout & Kraus, LLP.

(57) ABSTRACT

A magnet arrangement for generating an NMR-compatible homogeneous permanent magnetic field is described. The invention has two permanent magnets, referred to hereafter as main magnets, which each have a magnet pole surface area. The magnet pole surface areas are situated parallel and at a distance to one another, so that the main magnets define an interspace on both sides through their magnet surface areas. The magnet pole surfaces of the main magnets each have a magnetic polarization opposite to one another. At least two annular permanent magnets are used, which are referred to hereafter as ring magnets, are situated coaxially to one another and jointly radially bound a ring inner chamber. The ring magnets are situated relative to the two main magnets in so that the ring inner chamber at least regionally encloses the interspace, and the magnetic fields of the main and ring magnets are constructively superimposed.

13 Claims, 1 Drawing Sheet

U.S. PATENT DOCUMENTS

| | | | |
|---|---|---|---|
| 7,053,743 B2 * | 5/2006 | Laskaris et al. | 335/298 |
| 7,323,962 B2 * | 1/2008 | Xia | 335/296 |
| 7,759,938 B2 * | 7/2010 | Prado et al. | 324/319 |
| 2006/0055404 A1 | 3/2006 | Volke et al. | |
| 2006/0097725 A1 | 5/2006 | Callaghan et al. | |
| 2012/0013338 A1 * | 1/2012 | Sakellariou et al. | 324/318 |

\* cited by examiner

MAGNET ARRANGEMENT FOR GENERATING AN NMR-COMPATIBLE HOMOGENEOUS PERMANENT MAGNETIC FIELD

BACKGROUND OF THE INVENTION

1. Field of the Invention

The invention relates to a magnet arrangement for generating an NMR-compatible homogeneous permanent magnetic field.

2. Description of the Prior Art

NMR-imaging methods and also corresponding devices are used, inter alia, for the nondestructive material and structural study of objects which may comprise crystalline, glassy materials or soft materials, such as elastomers, or liquids, or biological materials.

A known NMR method and also a device for this purpose is described in DE 199 39 626 A1, in which a transportable NMR device is described. The known device provides two permanent magnets spaced apart from one another, which are used for generating a stationary magnetic polarization field. An HF coil arrangement and two gradient coils are provided between the permanent magnets, and the permanent magnets are used for generating a magnetic gradient field superimposed on the stationary magnetic polarization field, which is pulse operated at time intervals for the locally-resolved NMR measurement.

With the aid of the HF coil arrangement, which is also used as a receiving coil, in addition to generating the HF alternating field, high-frequency signals, which are caused by nuclear resonance processes occurring in the interior of the sample, are received and graphically displayed using an analysis unit. The nuclear resonance processes occurring in the interior of the sample are predominantly to be attributed to nuclear spin interactions of the hydrogen atoms with the stationary magnetic polarization field, which originate from a targeted energetic HF excitation by the HF alternating field, and may be related in the analysis in the broadest sense to the hydrogen concentration present inside the sample volume being studied.

The previously described NMR device does allow a planar study of an object by sliding over the object surface in the implementation of a transportable device, but the analyzable object volume is restricted to only a few millimeters by the very slight penetration depth of the magnetic fields which can be generated by the NMR device. It is certainly possible to improve the penetration depth into the object to be studied by corresponding size dimensioning of the permanent magnets being used, but scaling measures of this type are only capable of influencing the actual magnetic penetration depth insignificantly. In addition, the NMR device becomes unusable for portable use due to larger and thus heavier permanent magnets.

Another magnet arrangement for generating the most homogeneous possible stationary magnetic field for the use of NMR studies is described in U.S. Pat. No. 6,489,872, which essentially comprises two permanent magnets implemented as hollow cylinders, which are situated coaxially but spaced apart from one another axially. To perform an NMR study, at least one HF coil and a sample to be studied are provided between the two permanent magnets, that is, each outside the spatial areas enclosed by the particular hollow-cylindrical magnets.

A further alternative arrangement for generating an NMR-compatible permanent magnetic field is described in US Published Application 2006/0055404, in which according to one exemplary embodiment, a plurality of individual permanent magnets are situated on the concave side of a parabolic surface, which can preferably also be deformed in a controlled way. Using this magnet arrangement, it is possible in the course of constructive spatial superposition of a plurality of individual permanent magnetic fields to provide a local large elevated magnetic field within a very small spatial area, within which the magnetic field conditions required for the NMR study result.

A further NMR magnet arrangement also based on the above principle of constructive magnetic field superposition is described in US Published Application 2006/0097725, in which a plurality of cylindrical permanent magnets are situated annularly and axially inclined to one another, so that the individual magnetic fields are constructively superimposed to form an extensively homogeneous magnetic field along a shared axis of symmetry. Using an arrangement of this type, which allows a sample study accessible on one side, liquid samples may particularly advantageously be analyzed in the course of an NMR study.

SUMMARY OF THE INVENTION

The invention is a refined magnet arrangement for generating an NMR-compatible homogeneous permanent magnetic field in such a way that the arrangement is variable in size and is particularly also transportable. The magnetic field for NMR measurements generated using the magnet arrangement has particularly pronounced homogeneity and magnetic field strength. The arrangement is implemented using commercially available magnets as much as possible, so that it is simple, cost-effective, and additionally robust during handling. The arrangement is particularly able to be miniaturized and is to allow NMR measurements on small objects, preferably on biological samples.

The magnet arrangement according to the invention for generating an NMR-compatible homogeneous magnetic field is distinguished by two permanent magnets, which are referred to hereafter as the main magnets. Both main magnets each have at least one magnet surface area. The magnet surface areas of both main magnets are situated in parallel and at a distance from one another in such a way that the main magnets define an interspace on both sides through their magnet surface areas. As the further embodiments will show, in particular with reference to an advantageous exemplary embodiment, the main magnets are advantageously each implemented as cylindrical solid magnets and are spatially mounted in such a way that each frontal cylinder surface, which simultaneously represents a magnet pole, is situated coaxially and spaced apart from the frontal cylinder surface of the other permanent magnet. The magnetic polarizations of both front faces which are coaxially opposite to one another are selected to be opposing, so that an extensively cylindrical, homogeneous magnetic field can be implemented in the interspace between both cylindrical magnet pole surfaces.

In addition, at least two further annular permanent magnets are provided, which are referred to hereafter as "ring magnets" and are situated coaxially to one another and jointly radially bound a ring inner chamber. The ring magnets are situated in relation to both main magnets with their ring inner faces facing radially toward the interspace axially defined on both sides by the main magnets and thus radially enclose the interspace. The magnetic polarization of the ring magnets is selected in relation to the magnetic polarization of the main magnets in such a way that the magnetic fields of the main and ring magnets are constructively superimposed in the space defined and/or enclosed by the magnets. That is, the magnetic flux lines of the magnetic fields on the side of the main and ring magnets are oriented identically at least inside the ring inner chamber.

Through the additional provision according to the invention of a second magnetic field from the ring magnets which peripherally radially externally encloses the main magnetic field generated by the axially opposing main magnets, on the one hand, the magnetic field strength of the main magnetic field is increased as a result of the second magnetic field adding to the magnetic field of the main magnets. On the other hand, the magnetic field strength distribution is homogenized, whereby an extensively modernized magnetic field can be generated inside the interspace which is axially defined by the two magnet surface areas of the main magnets.

Both ring magnets, which peripherally enclose the main magnetic field generated by the main magnets, may advantageously be positioned both axially to the ring central axis and/or positioned independently of one another in order to achieve an optimized homogenization of the magnetic field enclosed by the permanent magnet arrangement in this way. A suitable fixing mechanism is used for this purpose, which is provided on at least one ring magnet, by which the at least one ring magnet can be positioned axially against the magnetic force acting between the two ring magnets.

In the same way, the two main magnets, which are frontally opposite to one another, may be positioned with regard to their relative location with the aid of a suitably implemented fixing mechanism.

A further magnet arrangement implemented according to the invention provides, instead of the ring magnets described above, a plurality of rod-shaped permanent magnets each having a rod longitudinal axis. These magnets are referred to hereafter as "rod magnets", which may fundamentally have an arbitrary rod cross section, but are particularly advantageously implemented as cylindrical solid magnets. The rod magnets are situated equally distributed along a closed peripheral line so that each magnet has a rod longitudinal axis oriented perpendicular to a surface which can be described by the peripheral line. The individual rod magnets each having an identically oriented magnetic polarization. Similar to the case described above pertaining to the use of two ring magnets, the plurality of the individual rod magnets also radially bounds an inner chamber, which at least regionally (partially) encloses the interspace defined on both sides by the magnet surface areas of both main magnets. The magnetic fields of the main and rod magnets superimposing constructively.

As shown by the further description in particular with reference to the corresponding exemplary embodiments, the plurality of the individual rod magnets are situated along a circular line, whose circle diameter is equal to or greater than the diameter of the magnet surface areas of both axially opposing main magnets, which are advantageously implemented as circular magnets.

For the purposes of an NMR study on a sample, for example, of seeds, the sample is introduced as centrally as possible within the so-called sample volume enclosed by both permanent magnet systems. In addition, an HF coil arrangement is to be provided in the sample volume in order to generate and acquire the NMR signals of the sample. For the loading and unloading of the permanent magnet arrangement with the appropriate NMR sample to be studied and also the HF coil arrangement in and/or from the sample volume, at least one main magnet can be axially displaced, in order to provide a one-sided access to the sample volume, which is otherwise extensively enclosed by the magnet arrangement. It is also possible to guide the HF coil arrangement by at least one main magnet and/or connect it thereto through corresponding feedthroughs.

It is possible through suitable material selection for the permanent magnets described above regarding the main and ring and/or rod magnets to generate field strengths of at least one tesla within the sample volume. For example, NdFeB alloys may be used for the implementation of the permanent magnets, using a magnetic resonance of approximately 1 T.

The special advantage of the magnet arrangement, which has a simple construction per se, relates to miniaturization, so that NMR studies can be performed at nearly arbitrary locations and using simple and thus cost-effective means. In particular in online operation for applications in the field of life and material sciences, the transportable permanent magnet arrangement according to the invention offers a favorable implementation capability for performing NMR studies, which has failed until now because of the prior art up to this point, which had high costs. The mobile permanent magnet system of the invention used for NMR studies, may be applied in particular in the pharmaceutical and chemical industries, for example, during quality control. Studies may thus also be performed similarly in the fields of biotechnology, materials testing, medicine, the fields of wood and construction, food technology, and in composite materials, to name only a few applications.

BRIEF DESCRIPTION OF THE DRAWINGS

The invention is described hereafter for exemplary purposes on the basis of exemplary embodiments with reference to the drawings without restriction of the general idea of the invention. In the figures.

DESCRIPTION OF EMBODIMENTS OF THE INVENTION

Figure 1:
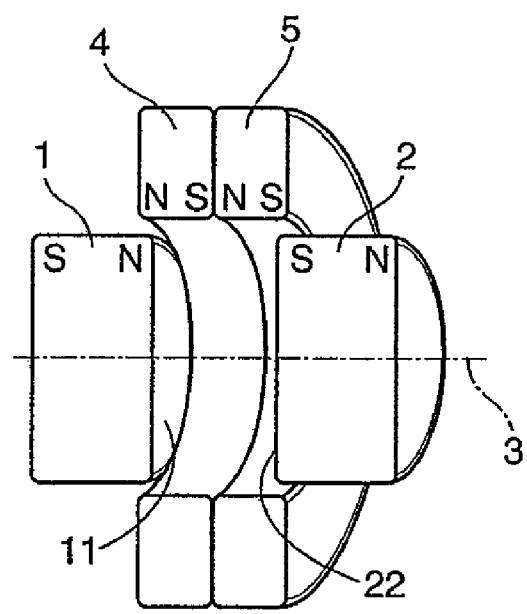
FIG. 1 shows a schematic longitudinal sectional illustration through a permanent magnet system.

A first exemplary embodiment for implementing the permanent magnet arrangement according to the invention is shown in FIG. 1, for generating a very strong and homogeneous magnetic field without electrical components. That is, generating a magnetic field exclusively on the basis of permanent magnets, which can be used for NMR studies. The permanent magnet arrangement thus has two main magnets 1, 2, which are each implemented as solid cylindrical magnets in the illustrated exemplary embodiment. Both main magnets 1, 2 are situated coaxially along a common cylinder axis 3 in such a way that their circular front faces 11, 22 which face toward one another, are positioned to be spaced apart from one another and axially completely mutually overlapping, so that they define an otherwise cylindrical interspace on both sides.

It is to be assumed that the main magnets 1, 2 implemented as solid cylinders are mounted so they are longitudinally displaceable along their shared cylinder axis 3, so that their mutual axial spacing is settable in a controlled way.

To implement the most homogeneous and strong magnetic field possible, which acts between the two main magnets 1, 2, the magnetic polarizations of both opposing front sides of the main magnets 1, 2 are selected having opposite poles.

To amplify the main magnetic field implemented between the two main magnets 1, 2 and also to homogenize it, two further magnets are provided. These ring magnets 4, 5, which are shaped and dimensioned to radially enclose a ring inner chamber, which encloses the interspace defined on both sides between both main magnets 1, 2, that is, the ring inner faces of the ring magnets 4, 5 enclose the interspace defined on both sides by both main magnets relative to the cylinder axis 3 in the radial direction.

The ring inner cross section does not necessarily have to coincide with the frontal cylinder areas of the main magnets 1, 2. Rather it is essential that the ring magnets 4, 5 enclose the interspace defined on both sides by the two main magnets 1, 2 with or without a gap, in order to cause a significant strengthening of the main magnetic field implemented between the two main magnets 1, 2 in this way and, in addition, to contribute to a significant homogenization of the main magnetic field.

The ring magnets 4, 5 can be positioned to be axially displaceable at least relative to one another and also relative to the main magnets 1, 2 for adjustment purposes. Because the ring magnets 4, 5 have a magnetization by which they are held together axially, for purposes of alignment, a fixing mechanism (not shown in greater detail) is provided, which causes spatial positioning of the ring magnets 4, 5 individually. Thus, for example, in particular through a fine adjustment of the ring magnets 4, 5, both the strength and also the homogeneity of the main magnetic field implemented between the two main magnets 1, 2 may be optimized.

The volume enclosed by all magnets, that is, both main magnets 1, 2 and the ring magnets 4, 5 shown in FIG. 1, correspond to the sample volume for performing NMR studies, which may be performed in a way known per se.

The permanent magnet arrangement according to the invention may advantageously be miniaturized. Sample volumes down to the micrometer range can thus be implemented, in which ultrasmall objects with a sample volume as small as 0.0005 cm$^3$ may be studied using NMR technology. It is also possible to implement the sample volume in the centimeter range through suitable dimensioning of the magnets, that is, having sample volumes of up to 200 cm$^3$.

Figure 2:
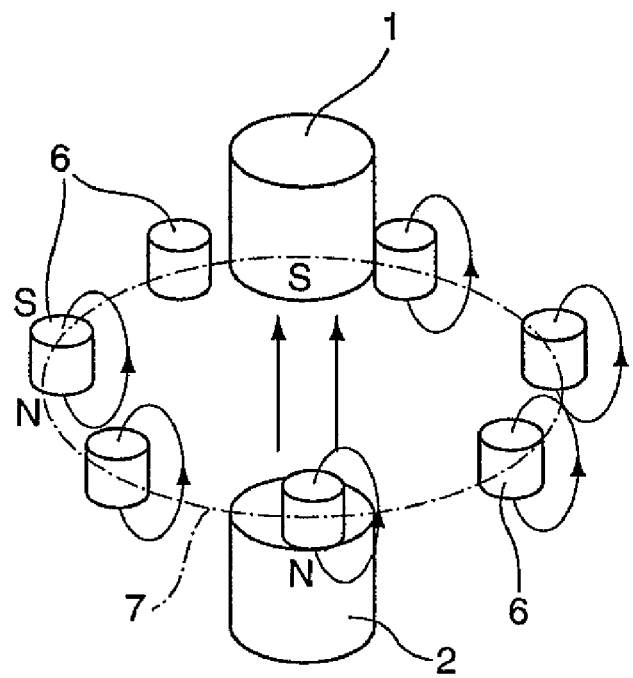
FIG. 2 shows a perspective illustration of a permanent magnet system having a plurality of individual rod magnets, situated along a circular line.

As an alternative to the use of the ring magnets 4, 5 shown in FIG. 1, a further embodiment for implementing the permanent magnet arrangement according to the invention is shown in FIG. 2. It is thus assumed in this case that instead of the annular magnets, a plurality of individual cylindrical rod magnets 6 is situated equally distributed along a circular line 7, the magnetic polarization of the individual rod magnets 6 being oriented identically to the main magnets 1, 2, as shown in FIG. 2. It is not absolutely necessary to implement the rod magnets 6 as cylindrical. Magnet cross-sections deviating from the circular shape are thus also conceivable.

LIST OF REFERENCE NUMERALS 1, 2 main magnets
11, 22 front faces of the main magnets
3 cylinder axis
4, 5 ring magnets
6 rod magnets
7 circular line

The invention claimed is:
1. A permanent magnet assembly for generating an NMR compatible homogeneous permanent magnetic field, comprising:
permanent solid cylindrical main magnets disposed on a common cylindrical axis, each solid cylindrical permanent main magnet including a planar magnet pole surface;
the planar magnet pole surfaces of the permanent solid cylindrical main magnets being parallel and spaced apart from each other to define an interspace on opposed sides of the magnet pole surfaces of a volume between 0.0005 cm$^3$ and 200 cm$^3$;
the opposed sides of the magnet pole surfaces respectively having an opposite magnetic polarization;
a plurality of permanent magnets positioned relative to each other to surround an inner chamber; and
the plurality of permanent magnets surrounding the permanent solid cylindrical main magnets so that the inner chamber at least partially encloses the interspace and lines of flux of magnetic fields of the permanent solid cylindrical main magnets and the plurality of permanent magnets are constructively superimposed and additive at least inside the interspace to form the NMR compatible homogeneous permanent magnetic field.

2. The magnet assembly according to claim 1, wherein:
the plurality of permanent magnets are annular and coaxial, have a mutually attractive magnetic polarization, and are oriented identically.

3. The magnet assembly according to claim 2, wherein:
the permanent solid cylindrical main magnets and the plurality of permanent magnets comprise a NdFeB alloy.

4. The magnet assembly according to claim 1, wherein:
the plurality of permanent magnets are annular and coaxial, and are connected to a fixing mechanism, which axially positions the annular magnets against an attractive magnetic force acting between the permanent solid cylindrical main magnets and the plurality of permanent magnets and annular permanent magnets and plurality of permanent magnets are oriented identically.

5. The magnet assembly according to claim 1, wherein:
the plurality of permanent magnets are cylindrical.

6. The magnet assembly according to claim 5, wherein:
the plurality of permanent magnets are disposed in a circle and are equally spaced along the circle.

7. The magnet assembly according to claim 1, wherein:
surface areas of the permanent solid cylindrical main magnets completely overlap in a projection of the magnet pole surfaces.

8. The magnet assembly according to claim 2, wherein:
the interspace between the permanent solid cylindrical main magnets is cylindrical, has an axial extension corresponding to a space between the permanent solid cylindrical main magnets and the interspace is completely enclosed by the at plurality of annular magnets.

9. The magnet assembly according to claim 1, wherein:
at least one of the permanent solid cylindrical magnets is axially displaceable to be perpendicular to the magnet pole surface thereof.

10. The magnet assembly according to claim 1, wherein:
the permanent solid cylindrical main magnets and the plurality of permanent magnets comprise a NdFeB alloy.

11. The magnet assembly according to claim 5, wherein:
the permanent solid cylindrical main magnets and the plurality of permanent magnets comprise a NdFeB alloy.

12. The magnet assembly according to claim 1, wherein:
at least one of the permanent solid cylindrical main magnets includes at least one feedthrough channel intersecting a magnetic pole surface.

13. The magnet assembly according to claim 1, wherein:
the inner chamber enclosed by the plurality of permanent magnets has a cross-sectional area which is greater than the magnet pole surfaces of the permanent solid cylindrical main magnets.

* * * * *